United States Patent
Uchida et al.

(10) Patent No.: US 9,056,943 B2
(45) Date of Patent: Jun. 16, 2015

(54) EPOXY RESIN COMPOSITION FOR OPTICAL SEMICONDUCTOR DEVICE AND OPTICAL SEMICONDUCTOR DEVICE USING THE SAME

(75) Inventors: Takahiro Uchida, Osaka (JP); Hiroshi Noro, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 346 days.

(21) Appl. No.: 13/478,848

(22) Filed: May 23, 2012

(65) Prior Publication Data

US 2012/0299039 A1    Nov. 29, 2012

(30) Foreign Application Priority Data

May 24, 2011   (JP) ................. 2011-115975

(51) Int. Cl.
| | |
|---|---|
| *H01L 23/29* | (2006.01) |
| *H01L 23/12* | (2006.01) |
| *C08G 59/42* | (2006.01) |
| *C08L 63/00* | (2006.01) |
| *C08L 83/06* | (2006.01) |
| *C08G 59/32* | (2006.01) |
| *C08G 59/68* | (2006.01) |

(52) U.S. Cl.
CPC .......... *C08G 59/4215* (2013.01); *H01L 23/296* (2013.01); *C08G 59/3245* (2013.01); *C08G 59/688* (2013.01); *C08L 63/00* (2013.01); *H01L 2924/0002* (2013.01)

(58) Field of Classification Search
CPC  H01L 23/293; H01L 23/296; C08G 59/3245; C08G 59/44; C08G 59/4215; C08G 59/62; C08G 59/688; C08L 63/00; C08L 83/04

USPC .................. 257/787, 788, 791, 793; 523/400; 525/474, 476, 523, 533; 428/413
See application file for complete search history.

(56) References Cited

U.S. PATENT DOCUMENTS

| | | |
|---|---|---|
| 2003/0071366 A1 | 4/2003 | Rubinsztajn et al. |
| 2006/0204760 A1 | 9/2006 | Ito |
| 2006/0204761 A1 | 9/2006 | Ito |
| 2010/0125116 A1* | 5/2010 | Shiobara et al. ............. 524/413 |
| 2010/0200882 A1* | 8/2010 | Kotani et al. .................. 257/98 |
| 2011/0039978 A1 | 2/2011 | Kotani et al. |
| 2011/0201763 A1* | 8/2011 | Noro et al. ................... 525/476 |
| 2011/0251305 A1* | 10/2011 | Ueno et al. .................. 523/429 |

FOREIGN PATENT DOCUMENTS

| | | |
|---|---|---|
| CN | 1827684 A | 9/2006 |
| CN | 1876710 A | 12/2006 |
| EP | 2 233 507 A1 | 9/2010 |
| EP | 2 289 998 A1 | 3/2011 |
| JP | 2006241230 A | 9/2006 |
| JP | 2006-274249 A | 10/2006 |

OTHER PUBLICATIONS

Communication dated Sep. 24, 2012 issued by the European Patent Office in counterpart European Patent Application No. 12169010.1.
Communication dated May 27, 2014 issued by the Japanese Patent Office in counterpart Japanese Patent Application No. 2011115975.
Office Action dated Sep. 22, 2014, issued by the State Intellectual Property Office of the P.R. China in counterpart Chinese Application No. 201210161770.5.

* cited by examiner

*Primary Examiner* — Michael J Feely
(74) *Attorney, Agent, or Firm* — Sughrue Mion, PLLC

(57) ABSTRACT

The present invention relates to an epoxy resin composition for an optical semiconductor device, including the following ingredients (A) to (E): (A) an epoxy resin; (B) an acid anhydride curing agent; (C) a curing accelerator; (D) a specific silicone resin; and (E) a specific alcohol compound.

6 Claims, No Drawings

EPOXY RESIN COMPOSITION FOR OPTICAL SEMICONDUCTOR DEVICE AND OPTICAL SEMICONDUCTOR DEVICE USING THE SAME

FIELD OF THE INVENTION

The present invention relates to an epoxy resin composition for an optical semiconductor device which is excellent in light transmittance and also light resistance against short wavelength (e.g., 350 to 500 nm) and an optical semiconductor device using the same.

BACKGROUND OF THE INVENTION

As a resin composition for encapsulation to be used at encapsulation of optical semiconductor elements such as light-emitting diodes (LED), it is required for a cured material of the composition to have transparency. In general, epoxy resin compositions obtained using epoxy resins such as bisphenol A epoxy resins or alicyclic epoxy resins and acid anhydrides as curing agents have been widely used.

In the case where the epoxy resin compositions are used as encapsulating materials of optical semiconductor elements, a sufficient light resistance has not been obtained in optical semiconductor devices obtained from the encapsulation, with the shortening of an emission wavelength (e.g., 350 to 500 nm).

For the reasons, in order to achieve an improvement in the light resistance, an epoxy resin composition for optical semiconductor element encapsulation using a specific silicone resin has been proposed (see Patent Document 1).

Patent Document 1: JP-A-2006-274249

SUMMARY OF THE INVENTION

However, the epoxy resin composition using a specific silicone resin can achieve a certain degree of improvement in the light resistance under a usual environmental atmosphere but a decrease in the light resistance is observed under severe conditions such as humidification conditions. Thus, it is strongly demanded that an excellent light resistance should be imparted even under more severe conditions.

The present invention has been devised in consideration of such circumstances and an object thereof is to provide an epoxy resin composition for an optical semiconductor device, which has, needless to say, a good light transmittance and also excellent in the light resistance, and an optical semiconductor device using the same.

Namely, the present invention relates to the following items (1) to (5).

(1) An epoxy resin composition for an optical semiconductor device, including the following ingredients (A) to (E):
(A) an epoxy resin;
(B) an acid anhydride curing agent;
(C) a curing accelerator;
(D) a silicone resin where a siloxane unit constituting the silicone resin is represented by the following general formula (1), the silicone resin has at least one hydroxyl group or alkoxy group bonded to a silicon atom in one molecule thereof, and, among monovalent hydrocarbon groups (R) bonded to silicon atoms, 10% or more by mol thereof are substituted or unsubstituted aromatic hydrocarbon groups;

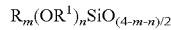 (1)

in which R is a substituted or unsubstituted saturated monovalent hydrocarbon group having 1 to 18 carbon atoms or an aromatic hydrocarbon group and may be the same or different from each other; $R^1$ is a hydrogen atom or an alkyl group having 1 to 6 carbon atoms and may be the same or different from each other; and m and n are each an integer of 0 to 3; and (E) an alcohol compound represented by the following general formula (2):

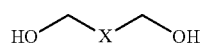 (2)

in which X is a single bond or a divalent hydrocarbon group having 1 to 22 carbon atoms.

(2) The epoxy resin composition for an optical semiconductor device according to item (1), in which the siloxane unit constituting the silicone resin is units D1 to D4 represented by the following general formulae (d1) to (d4), and constitutional proportions of the units D1 to D4 are set at the following proportions (α) to (δ):

Unit D1: $(R)_3SiO_{1/2}$ (d1);

Unit D2: $(R)_2(OR^1)_nSiO_{(2-n)/2}$ (d2)

in which n is 0 or 1;

Unit D3: $(R)(OR^1)_nSiO_{(3-n)/2}$ (d3)

in which n is 0, 1, or 2; and

Unit D4: $(OR^1)_nSiO_{(4-n)/2}$ (d4)

in which n is 0 or an integer of 1 to 3; in which R is a substituted or unsubstituted saturated monovalent hydrocarbon group 25 having 1 to 18 carbon atoms or an aromatic hydrocarbon group and may be the same or different from each other, and $R^1$ is a hydrogen atom or an alkyl group having 1 to 6 carbon atoms and may be the same or different from each other;

(α) unit D1 accounts for 0 to 30% by mol;
(β) unit D2 accounts for 0 to 80% by mol;
(γ) unit D3 accounts for 20 to 100% by mol; and
(δ) unit D4 accounts for 0 to 30% by mol.

(3) The epoxy resin composition for an optical semiconductor device according to item (1) or (2), in which the alcohol compound as the ingredient (E) is at least one compound selected from the group consisting of neopentyl alcoholglycol, 1,3-propanediol, diisobutylpropanediol, 2-propyl-1,3-propanediol, and 2-(4-ethylcyclohexyl)propane-1,2-diol.

(4) An optical semiconductor device obtained by encapsulating an optical semiconductor element with the epoxy resin composition for an optical semiconductor device according to any one of items (1) to (3).

(5) An optical semiconductor device including:
a lead frame for an optical semiconductor device, having an optical semiconductor element mounting region and having a reflector that surrounds at least a part of the region; and
an optical semiconductor element mounted on a predetermined position in the lead reframe.

In which the reflector is formed from the epoxy resin composition for an optical semiconductor device according to any one of items (1) to (3).

The present inventors have diligently made investigations in order to obtain an epoxy resin composition excellent in the light resistance even under more severe conditions, for example, under environmental conditions such as under a humidification atmosphere without decreasing light transmittance. As a result, the inventors have found that use of the specific silicone resin results in an excellent light resistance and the like. Furthermore, the inventors have found that, when the alcohol compound represented by the above general formula (2) is used together with the specific silicone resin, there is served an action that they are dissolved each other in the system and the resulting cured material can afford an excellent resistance to light deterioration without decreasing light transmittance. As a result, the inventors have found that the desired objects are accomplished and thus the invention has been achieved.

As shown above, the invention provides an epoxy resin composition for an optical semiconductor device which contains the alcohol compound [ingredient (E)] together with the epoxy resin [ingredient (A)], the acid anhydride curing agent [ingredient (B)], the curing accelerator [ingredient (C)], and the specific silicone resin [ingredient (D)]. Thus, an excellent light resistance is obtained by using the alcohol compound [ingredient (E)] as a modifier together with the specific silicone resin [ingredient (D)]. Accordingly, an excellent reliability is imparted to the optical semiconductor devices using the above epoxy resin composition in the optical semiconductor field and hence the functions thereof can be sufficiently exhibited.

Also, when the siloxane unit of the above silicone resin [ingredient (D)] is represented by the specific structural formulae (d1) to (d4) and the constitutional proportions of the units are set at specific ranges, respectively, an excellent low stress property is imparted to the resulting cured material.

Moreover, when the monovalent hydrocarbon group (R) of the silicone resin [ingredient (D)] is a methyl group or a phenyl group, compatibility thereof with the epoxy resin [ingredient (A)] is improved.

Furthermore, when the alcohol compound [ingredient (E)] is a specific compound, an effect of further suppressing deterioration of the light resistance is obtained.

DETAILED DESCRIPTION OF THE INVENTION

The epoxy resin composition for an optical semiconductor device (hereinafter also referred to as "epoxy resin composition") of the invention is obtained using the epoxy resin [ingredient (A)], the acid anhydride curing agent [ingredient (B)], the curing accelerator [ingredient (C)], the specific silicone resin [ingredient (D)], and the specific alcohol compound [ingredient (E)], and is usually supplied in a liquid or powder form or in the form of tablets obtained by tableting the powder.

Examples of the epoxy resin [component (A)] include bisphenol A epoxy resins, bisphenol F epoxy resins, novolac epoxy resins such as phenol-novolac epoxy resins and cresol-novolac epoxy resins, alicyclic epoxy resins, nitrogenous-ring epoxy resins such as triglycidyl isocyanurate (1,3,5-trisglycidyl isocyanurate) and hydantoin epoxy resins, hydrogenated bisphenol A epoxy resins, aliphatic epoxy resins, glycidyl ether epoxy resins, bisphenol S epoxy resins, biphenyl epoxy resins, which are mainly used as the type giving cured resins with a low water-absorption, dicyclic epoxy resins, and naphthalene epoxy resins. These epoxy resins may be used alone or in combination of two or more thereof. Of these epoxy resins, from the viewpoints of excellent transparency and discoloration resistance, it is preferred to use alicyclic epoxy resins represented by the following structural formula (a1) and triglycidyl isocyanurate either alone or in combination. Furthermore, from the viewpoints of compatibility with the specific silicone resin [ingredient (D)] to be mentioned later and light resistance, it is particularly preferred to use triglycidyl isocyanurate.

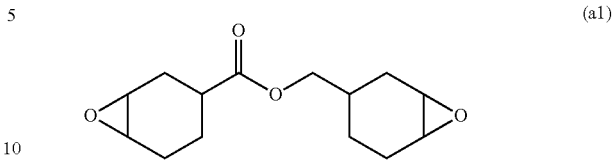

(a1)

The epoxy resin [ingredient (A)] may be solid or liquid at ordinary temperature. In general, it is preferred to use an epoxy resin having an epoxy equivalent of 90 to 1,000. In the case of solid epoxy resins, it is preferred to use an epoxy resin having a softening point of 160° C. or lower. The reasons for these are as follows. Too low epoxy equivalents may result in cases where the epoxy resin composition gives a brittle cured material. When the epoxy resin has too high epoxy equivalent, the epoxy resin composition tends to give a cured material having a lowered glass transition temperature (Tg).

Examples of the acid anhydride curing agent [ingredient (B)] include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. These may be used alone or in combination of two or more thereof. Of these acid anhydride curing agents, it is preferred to use phthalic anhydride, hexahydrophthalic anhydride, tetrahydrophthalic anhydride, and methylhexahydrophthalic anhydride. Moreover, as the acid anhydride curing agent, one having a molecular weight of around 140 to 200 is preferred and also use of a colorless or pale yellow acid anhydride curing agent is preferred.

The proportion of the epoxy resin [ingredient (A)] to the acid anhydride curing agent [ingredient (B)] is set so that the amount of active groups (acid anhydride groups or hydroxyl groups) in the acid anhydride curing agent [ingredient (B)] which are capable of reacting with an epoxy group is preferably 0.5 to 1.5 equivalents, more preferably 0.7 to 1.2 equivalents, per one equivalent of the epoxy group contained in the epoxy resin [ingredient (A)]. The reasons for this are as follows. In the case where the amount of the active groups is too small, there is a tendency that the epoxy resin composition has a reduced curing rate and gives a cured material having a lowered glass transition temperature (Tg). In the case where the amount of active groups is too large, moisture resistance tends to decrease.

Moreover, as the curing agent ingredient, depending on the purpose and use thereof, other curing agents for epoxy resins besides the above acid anhydride curing agent [ingredient (B)], for example, phenol curing agents, amine curing agents, curing agents obtained by partial esterification of the above acid anhydride curing agents with an alcohol, and curing agents of carboxylic acids such as hexahydrophthalic acid, tetrahydrophthalic acid, and methylhexahydrophthalic acid can be used alone or in combination of two or more thereof. For example, in the case where the curing agent of a carboxylic acid is used in combination, the curing rate can be accelerated and thus productivity can be improved. Even in the case of using these curing agents, the proportion thereof may be determined in accordance with the proportion (equivalent ratio) in the case of using the acid anhydride curing agent [ingredient (B)].

Examples of the curing accelerator [component (C)] include tertiary amines such as 1,8-diazabicyclo[5.4.0]undecene-7, triethylenediamine, and tri-2,4,6-dimethylaminomethylphenol; imidazoles such as 2-ethyl-4-methylimidazole and 2-methylimidazole; phosphorus compounds such as triphenylphosphine, tetraphenylphosphonium tetraphenyl borate, tetra-n-butylphosphonium-o,o-diethyl phosphorodithioate, and methyltributylphosphonium dimethylphosphate, quaternary ammonium salts, organic metal salts, and derivatives thereof. These may be used alone or in combination of two or more thereof. Of these curing accelerators, it is preferred to use tertiary amines, imidazoles, and phosphorus compound. It is especially preferred to use phosphorus compounds, among these curing accelerators, from the viewpoint of obtaining a cured material which has a low degree of coloration and is transparent and tough.

It is preferred that the content of the curing accelerator should be set at 0.01 to 8.0 parts by weight based on 100 parts by weight of the above epoxy resin [ingredient (A)]. More preferably, the content thereof is 0.1 to 3.0 parts by weight. The reasons for this are as follows. When the content of the curing accelerator is too low, there are cases where a sufficient curing-accelerating effect is not obtained. When the content is too high, the cured material obtained tends to discolor.

The above specific silicone resin [ingredient (D)] is usually called a polyorganosiloxane and is a polymer having a crosslinked structure with a siloxane bond. The specific silicone resin [ingredient (D)] has a characteristic feature that the siloxane unit constituting the silicone resin is represented by the following general formula (1), the resin has at least one hydroxyl group or alkoxy group bonded to a silicon atom in one molecule thereof, and, among monovalent hydrocarbon groups (R) bonded to silicon atoms, 10% by mol or more thereof are substituted or unsubstituted aromatic hydrocarbon groups.

$$R_m(OR^1)_nSiO_{(4-m-n)/2} \quad (1)$$

in which R is a substituted or unsubstituted saturated monovalent hydrocarbon group having 1 to 18 carbon atoms or an aromatic hydrocarbon group and may be the same or different from each other; $R^1$ is a hydrogen atom or an alkyl group having 1 to 6 carbon atoms and may be the same or different from each other; and m and n are each an integer of 0 to 3.

In the above formula (1), among the substituted or unsubstituted saturated monovalent hydrocarbon group having 1 to 18 carbon atoms and an aromatic hydrocarbon group, specific examples of the unsubstituted saturated monovalent hydrocarbon group include linear or branched alkyl groups such as a methyl group, an ethyl group, a propyl group, an isopropyl group, an n-butyl group, an isobutyl group, a t-butyl group, a pentyl group, an isopentyl group, a hexyl group, an isohexyl group, a heptyl group, an isoheptyl group, an octyl group, an isooctyl group, a nonyl group, and a decyl group and cycloalkyl groups such as a cyclopentyl group, a cyclohexyl group, a cyclooctyl group, a dicyclopentyl group, and a decahydronaphthyl group; and examples of the aromatic hydrocarbon group include aryl groups such as a phenyl group, a naphthyl group, a tetrahydronaphthyl group, a tolyl group, and an ethylphenyl group and aralkyl groups such as a benzyl group, a phenylethyl group, a phenylpropyl group, and a methylbenzyl group.

On the other hand, in R of the above formula (1), the substituted saturated monovalent hydrocarbon group specifically includes those where a part or all of the hydrogen atoms in the hydrocarbon group are replaced with a halogen atom, a cyano group, an amino group, an epoxy group, and the like, and specific examples thereof include substituted hydrocarbon groups such as a chloromethyl group, a 2-bromoethyl group, a 3,3,3-trifluoropropyl group, a 3-chloropropyl group, a chlorophenyl group, a dibromophenyl group, a difluorophenyl group, a β-cyanoethyl group, a γ-cyanopropyl group, and a β-cyanopropyl group.

As the above specific silicone resin [ingredient (D)], from the viewpoints of affinity with the epoxy resin and the properties of the resulting epoxy resin composition, preferred as R in the above formula (1) is an alkyl group or an aryl group. In the case of the alkyl group, more preferred are those exemplified as alkyl groups having 1 to 3 carbon atoms and particularly preferred is a methyl group. Moreover, particularly preferred as the aryl group is a phenyl group. These groups selected as R in the above formula (1) may be the same or different in the same siloxane unit or among the siloxane units.

In the above specific silicone resin [ingredient (D)], in the structure thereof, 10% by mol or more of the monovalent hydrocarbon groups (R) bonded to silicon atom should be selected from aromatic hydrocarbon groups. The reasons for these are as follows. When the content of the aromatic hydrocarbon groups is less than 10% by mol, the affinity with the epoxy resin is insufficient, so that the resulting composition becomes opaque in the case where the silicone resin is dissolved and dispersed in the epoxy resin and also a sufficient effect in the resistance to light deterioration and physical properties is not obtained also in the cured material of the obtained resin composition. The content of such an aromatic hydrocarbon groups is more preferably 30% by mol or more, particularly preferably 40% by mol or more. In this regard, an upper limit of the content of the aromatic hydrocarbon groups is 100% by mol.

Moreover, $(OR^1)$ in the above formula (1) is a hydroxyl group or an alkoxy group and $R^1$ in the case where (OR) is an alkoxy group is specifically an alkyl group having 1 to 6 carbon atoms in the alkyl groups exemplified with regard to the aforementioned R. More specific examples of $R^1$ include a methyl group, an ethyl group, and an isopropyl group. These groups may be the same or different in the same siloxane unit or among the siloxane units.

Furthermore, the above specific silicone resin [ingredient (D)] should have at least one hydroxyl group or alkoxy group bonded to a silicon atom in one molecule thereof, i.e., should have a $(OR^1)$ group of the formula (1) in at least one of the siloxane units constituting the silicone resin. The reasons for these are as follows. In the case where the resin does not have the hydroxyl group or alkoxy group, the affinity with the epoxy resin becomes insufficient. Also, with regard to the physical properties of the cured material formed from the resulting resin composition, satisfactory ones are not obtained, the reason of which is considered to be that the hydroxyl group or alkoxy group acts in some way during the curing reaction of the epoxy resin although the mechanism is not clear. In the above specific silicone resin [ingredient (D)], the amount of the hydroxyl group or alkoxy group bonded to a silicon atom is set at a range of preferably 0.1 to 15% by weight, more preferably 1 to 10% by weight in terms of an OH group. The reasons for these are as follows. When the amount of the hydroxyl group or alkoxy group is out of the above range, the affinity with the epoxy resin [ingredient (A)] becomes poor and particularly when the amount exceeds 15% by weight, there is a possibility that a self-dehydration reaction or a dealcoholization reaction may occur.

In the above formula (1), the numbers of repetition m and n are each an integer of 0 to 3. The possible numbers of the above numbers of repetition m and n vary in every siloxane unit. As further detailed illustration of the siloxane unit constituting the specific silicone resin, the units D1 to D4 represented by the following general formulae (d1) to (d4) may be mentioned.

$$\text{Unit } D1: (R)_3SiO_{1/2} \tag{d1}$$

$$\text{Unit } D2: (R)_2(OR^1)_nSiO_{(2-n)/2} \tag{d2}$$

in which n is 0 or 1;

$$\text{Unit } D3: (R)(OR^1)_nSiO_{(3-n)/2} \tag{d3}$$

in which n is 0, 1, or 2;

$$\text{Unit } D4: (OR^1)_nSiO_{(4-n)/2} \tag{d4}$$

in which n is 0 or an integer of 1 to 3;
in which R is a substituted or unsubstituted saturated monovalent hydrocarbon group having 1 to 18 carbon atoms or an aromatic hydrocarbon group and may be the same or different from each other; and $R^1$ is a hydrogen atom or an alkyl group having 1 to 6 carbon atoms and may be the same or different from each other.

Namely, in m of the above formula (1), the case of m=3 corresponds to the unit D1 represented by the formula (d1), the case of m=2 corresponds to the unit D2 represented by the formula (d2), the case of m=1 corresponds to the unit D3 represented by the formula (d3), and the case of m=0 corresponds to the unit D4 represented by the formula (d4). Of these, the unit D1 represented by the formula (d1) is one siloxane unit alone and is a structural unit constituting a terminal group, the unit D2 represented by the formula (d2) has two siloxane bonds and is a structural unit constituting a linear siloxane bond in the case where n is 0, and, in the case where n is 0 in the unit D3 represented by the formula (d3) or n is 0 or 1 in the unit D4 represented by the formula (d4), the units have three or four siloxane bonds and are structural units which contribute a branched structure or a crosslinked structure.

Furthermore, in the above specific silicone resin [ingredient (C)], the proportions of the units D1 to D4 are preferably set at the following proportions (a) to (6).

(α) unit D1 accounts for 0 to 30% by mol;
(β) unit D2 accounts for 0 to 80% by mol;
(γ) unit D3 accounts for 20 to 100% by mol; and
(δ) unit D4 accounts for 0 to 30% by mol.

More preferably, the unit D1 and the unit D4 account for 0% by mol, the unit D2 accounts for 0 to 70% by mol, and the unit D3 accounts for 30 to 100% by mol. The reasons for these are as follows. By setting the proportions of the units D1 to D4 at the above ranges, an effect that an appropriate hardness and elastic modulus can be imparted (maintained) to the cured material is obtained, so that the setting is further preferred.

In the above specific silicone resin [ingredient (D)], the above individual constitutional units are mutually or serially bonded and the polymerization degree of the siloxane units is preferably in the range of 6 to 10,000. The form of the specific silicone resin [ingredient (D)] varies depending on the polymerization degree and the crosslinking degree and may be either a liquid form or a solid form.

The specific silicone resin [ingredient (D)] can be produced by a known method. For example, the resin is obtained by a reaction of hydrolyzing at least one of an organosilane and an organosiloxane in the presence of a solvent such as toluene. Particularly, a method of hydrolyzing and condensing an organochlorosilane or an organoalkoxysilane is generally used. Here, the organo group is a group corresponding to R in the above formula (1), such as an alkyl group or an aryl group. The units D1 to D4 represented by the above formulae (d1) to (d4) correlate to the structures of the silanes to be used as raw materials, respectively. For example, in the case of chlorosilanes, the unit D1 represented by the formula (d1) is obtained when a triorganochlorosilane is used, the unit D2 represented by the formula (d2) is obtained when a diorganodichlorosilane is used, the unit D3 represented by the formula (d3) is obtained when a organochlorosilane is used, and the unit D4 represented by the formula (d4) is obtained when a tetrachlorosilane is used. Moreover, in the formulae (1), (d2) to (d4), the substituent of the silicon atom shown as $(OR^1)$ is an uncondensed residual group at hydrolysis.

The content of the specific silicone resin [ingredient (D)] is preferably set at a range of 10 to 60% by weight based on the whole epoxy resin composition. Particularly preferred is a range of 20 to 40% by weight. The reasons for these are as follows. When the content is less than 10% by weight, heat resistance and light resistance tend to decrease. When the content exceeds 60% by weight, brittleness of the resulting cured material itself of the resin composition tends to be remarkable.

The above specific alcohol compound [ingredient (E)] acts as a modifier of the epoxy resin composition and is an alcohol compound having two common hydroxyl groups in one molecule thereof, which is represented by the following general formula (2).

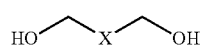
(2)

in which X is a single bond or a divalent hydrocarbon group having 1 to 22 carbon atoms.

In the above formula (2), X is a single bond or a divalent hydrocarbon group having 1 to 22 carbon atoms as mentioned above, but is preferably a single bond or a divalent hydrocarbon group represented by the following structural formula (x). In this regard, the single bond means that, in the formula (2), no divalent hydrocarbon group is present in X and the left and right carbon atoms sandwiching X are directly bonded.

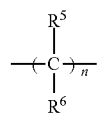
(x)

in which $R^5$ and $R^6$ are each a hydrogen atom or an alkyl group having 1 to 11 carbon atoms and may be the same or different from each other; and the number of repetition n is an integer of 1 to 3.

Specific examples of the alcohol compound [ingredient (E)] represented by the above formula (2) in the case where X in the formula (2) is represented by a single bond or the structural formula (x) include ethylene glycol, neopentyl glycol, 1,3-propanediol, diisobutylpropanediol, 2-propyl-1,3-propanediol, and 2-(4-ethylcyclohexyl)propane-1,2-diol. These may be used alone or in combination of two or more thereof. Of these alcohol compounds, from the viewpoint of further improvement in light resistance, neopentyl glycol, 1,3-propanediol, diisobutylpropanediol, 2-propyl-1,3-propanediol, and 2-(4-ethylcyclohexyl)propane-1,2-diol are more preferably used.

It is preferred that the content of the alcohol compound [ingredient (E)] should be set so that the content is 2 to 30% by mol based on the number of mol of the acid anhydride curing agent [ingredient (B)] contained in the epoxy resin composition, and more preferably, the content is 5 to 25% by mol. Namely, when the content of the alcohol compound [ingredient (E)] is too low, a sufficient effect of improving the light resistance is difficult to obtain. On the other hand, when the content is too high, there is a tendency that the glass transition temperature (Tg) of the cured material lowers and the light resistance decreases.

Various additives such as an antioxidant, a modifier other than the ingredient (E), various silane coupling agents, a defoaming agent, a leveling agent, a releasing agent, a dye, and a pigment can be suitably incorporated into the epoxy resin composition of the invention according to need, in addition to the ingredients (A) to (E) described above. On the other hand, in the case where the epoxy resin composition of the invention is used as a reflector-forming material, a white pigment such as titanium oxide may be suitably incorporated. Moreover, in the case where the optical semiconductor device of the invention is a light-emitting device emitting a light having an ultraviolet to blue wavelength, it is possible to form a white light-emitting device by dispersing a phosphor as a wavelength converter in a bulk or disposing the phosphor in the vicinity of a light-emitting element.

Examples of the antioxidant include antioxidants such as phenol compounds, amine compounds, organic sulfur compounds, and phosphine compounds.

Examples of the modifier include various modifiers other than the specific alcohol compound [ingredient (E)] mentioned beforehand.

Examples of the silane coupling agent include various silane coupling agents such as silanes and titanates.

Examples of the defoaming agent include defoaming agents such as silicones.

The epoxy resin composition of the invention can be produced as follows to thereby obtain as a liquid form, a powder form, or tablets obtained by tableting the powder. Namely, in order to obtain the liquid epoxy resin composition, for example, the composition can be obtained by incorporating the above ingredients (A) to (E) and various additives appropriately incorporated according to need. Moreover, in order to obtain the composition as a powder form or tablets obtained by tableting the powder, for example, the composition can be obtained by incorporating and pre-mixing the above ingredients (A) to (E) and various additives appropriately incorporated according to need, then kneading and melt-mixing by a kneader, and, after cooling to room temperature, pulverizing the resulting mixture by a known method via an aging step, and further tableting the mixture according to need.

<Use for Optical Semiconductor Encapsulation>

The thus-obtained epoxy resin composition of the invention is used for encapsulation of optical semiconductor elements such as LED and charge-coupled devices (CCD). Namely, the encapsulation of the optical semiconductor elements with the epoxy resin composition of the invention is not particularly limited and can be performed by known molding methods such as usual transfer molding and casting. In the case where the epoxy resin composition of the invention is a liquid form, the composition may be used as a so-called two-component type one where at least an epoxy resin ingredient and an acid anhydride curing agent ingredient are separately stored and both are mixed immediately before use. Moreover, in the case where the epoxy resin composition of the invention is a powder form or tablets after passing through a predetermined aging step, the above individual mixing ingredients may be transformed into a B-stage (semi-cured) form at its melt-mixing and may be melted under heating at use.

Moisture resistance can be imparted to the resulting semiconductor device by encapsulating the optical semiconductor element with the epoxy resin composition of the invention and thus, the deterioration of luminance of the device can be suppressed. Therefore, the optical semiconductor device in which the optical semiconductor element is encapsulated with the epoxy resin composition of the invention is excellent in reliability and an effect of suppressing luminance deterioration under a humidification environment, so that the functions thereof can be fully exhibited.

The optical semiconductor device obtained using the epoxy resin composition of the invention can emit a white light as a white light-emitting device using a short-wavelength (e.g., 350 to 500 nm) light source by providing a phosphor for light conversion in the vicinity of an emitting element or dispersing the phosphor itself inside the encapsulating resin including the epoxy resin composition of the invention.

<Use for Reflector Formation>

On the other hand, the epoxy resin composition of the invention can be used for a reflector formation use. Namely, a metallic lead frame is disposed within a mold of a transfer molding machine, and the epoxy resin composition of the invention is used to form a reflector by transfer molding. The reflector is formed so as to surround a region where an optical semiconductor element is to be mounted. Thus, a metallic lead frame for an optical semiconductor device is fabricated. Subsequently, an optical semiconductor element is mounted on the optical semiconductor element mounting region which is located on the metallic lead frame and inside the reflector, and wire bonding is conducted according to need. Thus, an optical semiconductor device is fabricated, the device being a unit equipped with a metallic lead frame and with an optical semiconductor element mounted on the metallic lead frame. the reflector having been formed so as to surround the optical semiconductor element. In the optical semiconductor device, usually, the region which is located inside the reflector and which includes the optical semiconductor element is encapsulated with a silicone resin or the like.

EXAMPLES

The following will describe Examples together with Comparative Examples. However, the invention should not be construed as being limited to these Examples.

First, prior to the production of epoxy resin compositions, the ingredients shown below were prepared.

[Epoxy Resin]
Triglycidyl isocyanurate (epoxy equivalent: 100)

[Acid Anhydride Curing Agent]
A mixture of 4-methylhexahydrophthalic anhydride (b1) and hexahydrophthalic anhydride (b2) [acid anhydride equivalent: 168, a mixing weight ratio of b1 to b2 (b1:b2)=7:3]

[Curing Accelerator]
Methyltributylphosphonium dimethyl phosphate represented by the following structural formula (c):

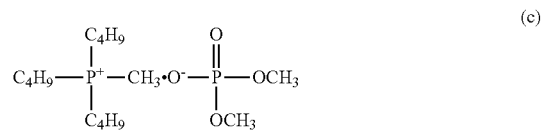

[Silicone Resin]

A mixture of 148.2 g (66% by mol) of phenyltrichlorosilane, 38.1 g (24% by mol) of methyltrichlorosilane, 13.7 g (10% by mol) of dimethyldichlorosilane and 215 g of toluene was added dropwise to a mixed solvent of 550 g of water, 150 g of methanol and 150 g of toluene prepared beforehand in a flask with vigorously stirring over a period of 5 minutes. The temperature in the flask was risen to 75° C. and stirring was continued for 10 minutes without further treatment. After the solution was allowed to stand and cooled to room temperature (25° C.), the separated aqueous layer was removed and subsequently, a water-washing operation of mixing with water, stirring, then allowing to stand, and removing the aqueous layer was repeated until the toluene layer became neutral. The remaining organic layer was continuously refluxed for 30 minutes to removed water and a part of toluene by distillation. After the obtained toluene solution of an organosiloxane was filtrated to remove impurities, the still remaining toluene was removed by distillation under reduced pressure by a rotary evaporator, thereby obtaining a solid silicone resin. The obtained silicone resin contained 6% by weight of an OH group. The raw material chlorosilane used was all reacted and the obtained silicone resin was composed of 10% by mol of the unit D2 and 90% by mol of the unit D3 and contained phenyl group and methyl group in the ratios of 60% and 40%, respectively.

[Alcohol Compound e1]

2,2-Dimethyl-1,3-propanediol (neopentyl glycol) represented by the following structural formula (e1):

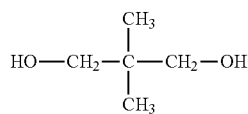

(e1)

[Alcohol Compound e2]

1,3-Propanediol represented by the following structural formula (e2):

HO—CH$_2$—CH$_2$—CH$_2$—OH   (e2)

[Alcohol Compound e3]

2,2'-Diisobutyl-1,3-propanediol represented by the following structural formula (e3):

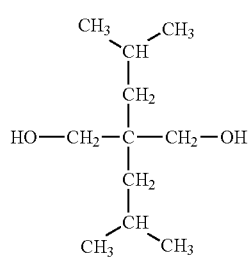

(e3)

[Alcohol Compound e4 (for Comparative Example)]

Trimethylolpropane [1,1,1-tris(hydroxymethyl)propane] represented by the following structural formula (e4):

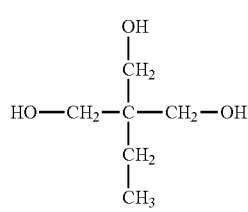

(e4)

[Antioxidant s1]

9,10-Dihydro-9-oxa-10-phosphaphenanthrene-10-oxide represented by the following structural formula (s1):

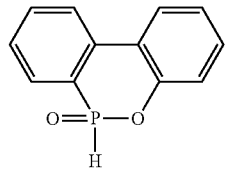

(s1)

[Antioxidant s2]

Tetrakis[methylene(3,5-di-tert-butyl-4-hydroxyhydrocinnamate)]methane represented by the following structural formula (s2):

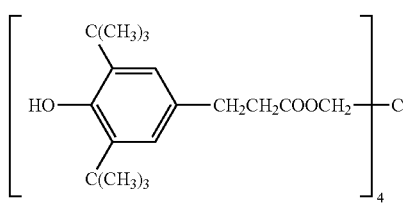

(s2)

Examples 1 to 5, Comparative Examples 1 and 2

The ingredients shown in Table 1 given later were put together according to each of the formulations shown in the table. Thus, desired epoxy resin compositions were produced.

The epoxy resin compositions of Examples and Comparative Examples thus obtained were measured/evaluated for light resistance (luminance maintaining ratio). The results thereof are also shown in Table 1.

[Luminance Maintaining Ratio]

Using each epoxy resin composition, InGaN (wavelength 405 nm) LED was encapsulated into a bullet-shape lamp having a diameter of 5 mm by potting (120° C.×1 hour) and further cured at 150° C. for 3 hours, thereby producing an optical semiconductor device. Then, continuous emitting at 30 mA (rating 20 mA) was performed at ordinary temperature (25° C.) under an atmosphere without humidification and the luminance was measured and taken as 100% as a standard. Then, continuous emitting at 30 mA (rating 20 mA) was performed at ordinary temperature (25° C.) under humidification conditions (85° C.×85%) and the luminance after the passage of 1,000 hours was measured. Thus, the luminance deterioration maintaining ratio relative to the above case at ordinary temperature without humidification was investigated (luminance measuring apparatus: an opto device automatic inspection apparatus manufactured by TECHNOS Corp.). Here, the number of samples (number n) for each optical semiconductor device was 5 samples and an average value thereof was shown.

TABLE 1

|  |  | Example | | | | | Comparative Example (part(s) by weight) | |
| --- | --- | --- | --- | --- | --- | --- | --- | --- |
|  |  | 1 | 2 | 3 | 4 | 5 | 1 | 2 |
| Epoxy resin (A) |  | 100 | 100 | 100 | 100 | 100 | 100 | 100 |
| Acid anhydride curing agent (B) |  | 155 | 155 | 155 | 155 | 155 | 155 | 155 |
| Curing accelerator (C) |  | 3 | 3 | 3 | 3 | 3 | 3 | 3 |
| Silicone resin (D) |  | 68 | 70 | 67 | 70 | 66 | 65 | 72 |
| Alcohol compound (E) | e1 | 13 | 23 | — | — | 5 | — | — |
|  | e2 | — | — | 9 | — | — | — | — |
|  | e3 | — | — | — | 23 | — | — | — |
|  | e4 | — | — | — | — | — | — | 30 |
| Antioxidant s1 |  | 1 | 1 | 1 | 1 | 1 | 1 | 1 |
| Antioxidant s2 |  | 1 | 1 | 1 | 1 | 1 | 1 | 1 |
| Molar amount of alcohol compound (mol) |  | 0.12 | 0.22 | 0.12 | 0.12 | 0.05 | — | 0.22 |
| Content of alcohol compound (% by mol/number of mol of acid anhydride curing agent)* |  | 13.6 | 24.2 | 13.5 | 13.5 | 5.2 | — | 24.2 |
| Luminance maintaining ratio after passage of 1,000 hours (%) |  | 74 | 69 | 72 | 87 | 74 | 65 | 58 |

*It was shown as % by mol of the alcohol compound relative to the number of mol of the acid anhydride curing agent.

From the above results, it is revealed that the compositions of Examples all have a high luminance maintaining ratio and are excellent in light resistance.

To the contrary, the composition of Comparative Example 1 where no alcohol compound was incorporated showed a result that the luminance maintaining ratio was inferior to the compositions of Examples. Moreover, the composition of Comparative Example 2 where the alcohol compound e4 having three primary hydroxyl groups in one molecule was used showed a result that the luminance maintaining ratio was inferior to the compositions of Examples, similarly to the above.

The epoxy resin composition for an optical semiconductor device of the invention is useful as a material for encapsulating optical semiconductor elements such as LED and CCD and a material for forming a reflector that reflects light emitted from an optical semiconductor element mounted on a lead frame.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2011-115975 filed on May 24, 2011, and the contents are incorporated herein by reference.

All references cited herein are incorporated by reference herein in their entirety.

What is claimed is:

1. An epoxy resin composition for an optical semiconductor device, comprising the following ingredients (A) to (E):
   (A) an epoxy resin;
   (B) an acid anhydride curing agent;
   (C) a curing accelerator;
   (D) a silicone resin where a siloxane unit constituting the silicone resin is represented by the following general formula (1), the silicone resin has at least one hydroxyl group or alkoxy group bonded to a silicon atom in one molecule thereof, and, among monovalent hydrocarbon groups (R) bonded to silicon atoms, 10% by mol or more thereof are substituted or unsubstituted aromatic hydrocarbon groups;

$$R_m(OR^1)_n SiO_{(4-m-n)/2} \quad (1)$$

wherein R is a substituted or unsubstituted saturated monovalent hydrocarbon group having 1 to 18 carbon atoms or an aromatic hydrocarbon group and may be the same or different from each other; $R^1$ is a hydrogen atom or an alkyl group having 1 to 6 carbon atoms and may be the same or different from each other; and m and n are each an integer of 0 to 3; and (E) an alcohol compound represented by the following general formula (2):

$$(2)$$

wherein X is a single bond or a divalent hydrocarbon group having 1 to 22 carbon atoms,
   wherein a content of the alcohol compound as the ingredient (E) is 5 to 25% by mol based on the number of mol of the acid anhydride curing agent as the ingredient (B).

2. The epoxy resin composition for an optical semiconductor device according to claim 1, wherein the siloxane unit constituting the silicone resin is units D1 to D4 represented by the following general formulae (d1) to (d4), and constitutional proportions of the units D1 to D4 are set at the following proportions (a) to (6):

Unit D1: $(R)_3 SiO_{1/2}$ (d1);

Unit D2: $(R)_2(OR^1) SiO_{(2-n)/2}$ (d2)

wherein n is 0 or 1;

Unit D3: $(R)(OR^1)_n SiO_{(3-n)/2}$ (d3)

wherein n is 0, 1, or 2; and

Unit D4: $(OR^1)_n SiO_{(4-n)/2}$ (d4)

wherein n is 0 or an integer of 1 to 3;

wherein R is a substituted or unsubstituted saturated monovalent hydrocarbon group having 1 to 18 carbon atoms or an aromatic hydrocarbon group and may be the same or different from each other, and $R^1$ is a hydrogen atom or an alkyl group having 1 to 6 carbon atoms and may be the same or different from each other;
   (α) unit D1 accounts for 0 to 30% by mol;
   (β) unit D2 accounts for 0 to 80% by mol;
   (γ) unit D3 accounts for 20 to 100% by mol; and
   (δ) unit D4 accounts for 0 to 30% by mol.

3. The epoxy resin composition for an optical semiconductor device according to claim 1, wherein the alcohol compound as the ingredient (E) is at least one compound selected from the group consisting of neopentyl glycol, 1,3-propanediol, diisobutylpropanediol, 2-propyl-1,3-propanediol, and 2-(4-ethylcyclohexyl)propane-1,2-diol.

4. The epoxy resin composition for an optical semiconductor device according to claim 1, wherein the content of the alcohol compound as the ingredient (E) is 5 to 24.2% by mol based on the number of mol of the acid anhydride curing agent as the ingredient (B).

5. An optical semiconductor device obtained by encapsulating an optical semiconductor element with the epoxy resin composition for an optical semiconductor device according to claim 1.

6. An optical semiconductor device comprising:
   a lead frame for an optical semiconductor device, having an optical semiconductor element mounting region and having a reflector that surrounds at least a part of the region; and
   an optical semiconductor element mounted on a predetermined position in the lead frame,
   wherein the reflector is formed from the epoxy resin composition for an optical semiconductor device according to claim 1.

* * * * *